(12) United States Patent
Pooser et al.

(10) Patent No.: US 9,773,876 B2
(45) Date of Patent: Sep. 26, 2017

(54) SEMICONDUCTOR COMPOSITION CONTAINING IRON, DYSPROSIUM, AND TERBIUM

(71) Applicants: UT-Battelle, LLC, Oak Ridge, TN (US); University of Tennessee Research Foundation, Knoxville, TN (US)

(72) Inventors: Raphael C. Pooser, Knoxville, TN (US); Benjamin J. Lawrie, Oak Ridge, TN (US); Arthur P. Baddorf, Knoxville, TN (US); Abhinav Malasi, Knoxville, TN (US); Humaira Taz, Knoxville, TN (US); Annettee E. Farah, Knoxville, TN (US); Ramakrishnan Kalyanaraman, Knoxville, TN (US); Gerd Josef Mansfred Duscher, Knoxville, TN (US); Maulik K. Patel, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 15/194,715

(22) Filed: Jun. 28, 2016

(65) Prior Publication Data
US 2017/0005170 A1    Jan. 5, 2017

Related U.S. Application Data

(60) Provisional application No. 62/187,859, filed on Jul. 2, 2015.

(51) Int. Cl.
C03C 4/00 (2006.01)
H01L 29/24 (2006.01)
(Continued)

(52) U.S. Cl.
CPC .............. *H01L 29/247* (2013.01); *C03C 3/12* (2013.01); *C03C 4/00* (2013.01); *C03C 17/02* (2013.01); *C23C 14/08* (2013.01); *H01L 29/786* (2013.01)

(58) Field of Classification Search
CPC ..... H01L 29/247; H01L 29/786; C23C 14/08; C03C 17/02; C03C 3/12; C03C 4/00
See application file for complete search history.

(56) References Cited

U.S. PATENT DOCUMENTS 4,957,549 A    9/1990  Matsumoto et al.
5,225,289 A    7/1993  Kobayashi
(Continued)

OTHER PUBLICATIONS

Rick Allen Kellogg, "The Delta-E Effect in Terfenol-D and its Application in a Tunable Mechanical Resonator," Iowa State University, 2000.
(Continued)

*Primary Examiner* — Kyoung Lee
(74) *Attorney, Agent, or Firm* — Edna I. Gergel; Joseph A. Marasco (57) ABSTRACT

An amorphous semiconductor composition includes 1 to 70 atomic percent iron, 15 to 65 atomic percent dysprosium, 15 to 35 atomic percent terbium, balance X, wherein X is at least one of an oxidizing element and a reducing element. The composition has an essentially amorphous microstructure, an optical transmittance of at least 50% in at least the visible spectrum and semiconductor electrical properties.

20 Claims, 8 Drawing Sheets

(51) Int. Cl.
*H01L 29/786* (2006.01)
*C03C 3/12* (2006.01)
*C03C 17/02* (2006.01)
*C23C 14/08* (2006.01)

(56) References Cited

U.S. PATENT DOCUMENTS

| | | | |
|---|---|---|---|
| 5,588,466 | A | 12/1996 | Benz et al. |
| 6,849,195 | B2 | 2/2005 | Basheer et al. |
| 7,179,339 | B2 * | 2/2007 | Tai .................... H01L 41/20 148/301 |
| 7,550,401 | B2 | 6/2009 | Nunn |
| 8,604,569 | B2 | 12/2013 | Hosotani et al. |
| 8,617,456 | B1 | 12/2013 | Pechenik et al. |

OTHER PUBLICATIONS

Toshiyuki Nohira, "Electrochemical Formation of Tb—Fe Alloys in Molten Chlorides," Kyoto University.

* cited by examiner

SEMICONDUCTOR COMPOSITION CONTAINING IRON, DYSPROSIUM, AND TERBIUM

CROSS-REFERENCE TO RELATED APPLICATIONS

This application claims priority to U.S. Provisional Patent Application No. 62/187,859 filed on Jul. 2, 2015, which is incorporated herein in its entirety by reference.

STATEMENT REGARDING FEDERALLY SPONSORED RESEARCH

The United States Government has rights in this invention pursuant to contract no. DE-AC05-00OR22725 between the United States Department of Energy and UT-Battelle, LLC.

NAMES OF PARTIES TO A JOINT RESEARCH AGREEMENT

The invention was made under a joint research agreement with University of Tennessee Research Foundation.

BACKGROUND OF THE INVENTION

Thin film semiconductor materials form the basis for electronics industry from which many commonly used devices and popular technologies are generated. For example, semiconductors are needed to make transistors and memory chips used in computers and cell phones, they are used to generate energy from the sun via photovoltaic effects or from heat via thermoelectric effects, they can be used to catalyze chemical reactions, and are also essential to create display technologies. Ongoing efforts are underway across the industry to provide new semiconductor materials having improved performance while easier and less expensive to make. In particular, semiconductors having amorphous crystal structures are sought because they can be fabricated cheaply over large areas.

Among the available amorphous semiconductor materials only ZnO or $SnO_2$ doped with other materials such as In, Ga, Al, etc. have found application in technologies such as touch screen and active matrix displays. This is partly due to the need for a combination of requirements such as optical transparency, low processing temperatures, stability, good semiconductor performance and low material cost. Among these materials, Indium metal is the basis for a number of the high performing amorphous oxide semiconductors (e.g. In—Ga—Zn—O or IGZO) requiring high carrier hall mobility (>10 $cm^2$/V-s) in amorphous state. However, Indium is a precious metal; its low earth abundance is detrimental to its usage. There is a need to alleviate difficulties such as the scarcity of indium.

Among available amorphous semiconductor materials, none have shown the ability to combine ferromagnetism at room temperature along with transparency and semiconductor behavior. Such a material could help advance technology and applications pertaining to control of the spin of charge carriers, such as used in spintronic devices, the most popular example being the giant magnetoresistive effect which is based on crystalline thin films. Therefore, if an amorphous thin film combining room temperature ferromagnetism with transparency and semiconductor behavior can be found, it has the potential for immediate impact on spintronic technologies.

Among available amorphous oxide semiconductor materials, very few have shown the ability to transport current using electrons (i.e. n-type) as well as by holes (i.e. p-type. Having a semiconductor material that can show both n- and p-type behaviors makes them candidates for monolithic semiconductor devices, such as the Silicon based technologies. Furthermore, an amorphous oxide semiconductor shown in both n- and p-type makes it feasible to achieve all amorphous oxide electronics. Such a material could help reduce the cost of computer and display technologies.

Terfenol-D is a well-known metal alloy having a cubic crystalline microstructure, often defined by the formula $Tb_xDy_{1-x}Fe_2$ where $x \approx 0.3$; Terfenol-D is also often defined as having a stoichiometry of $Tb_xDy_{1-x}Fe_y$ where $x \approx 0.3$ and $y \approx 2.0$. Therefore, Terfenol-D is known to generally consist of about 66.67 atomic percent iron, about 23.33 atomic percent dysprosium, and about 10 atomic percent terbium. Stoichiometry of Terfenol-D has been measured and found to be $Tb_{0.27}Dy_{0.73}Fe_{1.95}$, which translates to 65 atomic percent iron, about 24 atomic percent dysprosium, and about 9 atomic percent terbium.

Terfenol-D is known to have the highest magnetostriction of any alloy, up to 0.002 m/m at saturation, and was developed for use in naval sonar systems. Terfenol-D is also used in magnetomechanical sensors, actuators, and acoustic and ultrasonic transducers, and the like.

BRIEF SUMMARY OF THE INVENTION

In accordance with one aspect of the present invention, the foregoing and other objects are achieved by an amorphous semiconductor composition that includes 1 to 70 atomic percent iron, 15 to 65 atomic percent dysprosium, 15 to 35 atomic percent terbium, balance X, wherein X is at least one of an oxidizing element and a reducing element. The composition has an essentially amorphous microstructure, an optical transmittance of at least 50% in at least the visible spectrum and semiconductor electrical properties.

In accordance with another of the present invention, a semiconductor device includes a substrate having an amorphous semiconductor layer adherently disposed thereon, the amorphous semiconductor composition including 1 to 70 atomic percent iron, 15 to 65 atomic percent dysprosium, 15 to 35 atomic percent terbium, balance X, wherein X is at least one of an oxidizing element and a reducing element. The composition has an essentially amorphous microstructure, an optical transmittance of at least 50% in at least the visible spectrum and semiconductor electrical properties.

For a better understanding of the present invention, together with other and further objects, advantages and capabilities thereof, reference is made to the following disclosure and appended claims in connection with the above-described drawings.

DETAILED DESCRIPTION OF THE INVENTION

A new, amorphous, ferromagnetic semiconductor composition Fe—Dy—Tb—X comprises 1 to 70 atomic percent iron, 15 to 65 atomic percent dysprosium, 15 to 35 atomic percent terbium, and various amounts of oxidizing and/or reducing elements (X) such as oxygen, sulfur, hydrogen and nitrogen. Iron content can be in the range of 10 to 60 atomic percent, and further can be in the range of 10 to 50 atomic percent. Dysprosium content can be in the range of 25 to 55 atomic percent. Terbium content can be in the range of 20 to 30 atomic percent Other elements may be present in quantities so small so as to have no significant effect on the chemical characteristics, physical characteristics or behavior of the composition.

Amounts of oxidizing and/or reducing elements (X) can be controlled by the conditions during thin film processing and by additional processing steps following thin film deposition, such as thermal annealing, as described hereinbelow.

In some embodiments, the composition can be characterized by an optical transmittance of at least 30% in at least the visible spectrum. In other embodiments, the composition can be characterized by an optical transmittance of at least 40% in at least the visible spectrum. In other embodiments, the composition can be characterized by an optical transmittance of at least 50% in at least the visible spectrum. Moreover, the composition can be characterized by semiconductor electrical behavior, high carrier hall mobility, room temperature ferromagnetism, mechanical flexibility, and room temperature manufacturability, as further described herein.

One method of making thin amorphous films of the Fe—Dy—Tb—X is by using pulsed laser deposition (PLD) onto a substrate in high vacuum conditions (generally up to about 10$^{-8}$ Torr of base pressure) from a starting target material of composition found in well-known, commercially available Terfenol-D alloys. A thin film deposition rate for the PLD process can be in the range of 0.01 Angstroms per minute to 0.5 Angstroms per minute.

The oxidation process (a form of thermal annealing) can be performed by exposing the deposited film to air inside the chamber, by removing into ambient air, both of which could be at room temperature. Alternately, the film can be oxidized by exposing it to air or other gases at a higher temperature on a hot plate or in a furnace in order to further change/control properties of the film.

The PLD process can be carried out with substrates held at low temperatures, such as, for example, ambient temperature (also known as room temperature), which is generally regarded as being in the range of 20 to 25° C. Ambient temperature manufacturability is a desirable and advantageous aspect for the formation of technologically relevant materials, such as the amorphous Fe—Dy—Tb—X thin films. Since most technologically relevant metal oxide film require crystallinity, they typically involve growth and or additional processing at temperatures above 400° C. The PLD process has the advantage of maintaining the stoichiometry of the target material and therefore is very useful for manufacturing processing requiring good control of thin films composed of multiple elements.

Nitridation, sulfurization and/or hydrogenation processes (a form of thermal annealing) for PLD evaporated films can be performed by exposing the deposited film to pertinent gases inside the chamber either during or after metal deposition at room temperature or higher temperatures. Alternately, such processes can be achieved by exposing the film to pertinent gases at a higher temperature in a furnace. These steps can also be used to further change/control the materials properties.

Another method of making thin amorphous films of the Fe—Dy—Tb—X is by using electron beam evaporation (e-beam) onto a substrate in high vacuum conditions (generally up to about 10$^{-8}$ Torr of base pressure) from a starting target material of composition found in well-known, commercially available Terfenol-D alloys or in a solid target containing other combinations of Fe, Dy and Tb. A thin film deposition rate for the e-beam process can be in the range of 0.1 Angstroms per minute to 1000 Angstroms per minute.

The e-beam process can be carried out with substrates held at low temperatures, such as, for example, ambient temperature (also known as room temperature), which is generally regarded as being in the range of 20 to 25° C. Ambient temperature manufacturability is a desirable and advantageous aspect for the formation of technologically relevant materials, such as the amorphous Fe—Dy—Tb—X thin films. Since the e-beam process allows significantly larger range of growth rates, as well as higher growth rates of the films, this makes it a desirable attribute for manufacturing purposes.

Oxidation process for e-beam evaporated films can be performed by exposing the deposited film to air inside the chamber, or by removing into ambient air, both of which could be at room temperature. Alternately, the film can be oxidized by exposing the film to air or other gases at a higher temperature on a hot plate or in a furnace in order to further change/control its properties.

Nitridation, sulfurization, and/or hydrogenation processes for e-beam evaporated films can be performed by exposing the deposited film to pertinent gases at high temperature inside a furnace. This can also further change/control the materials properties.

Yet another method of making thin amorphous films of the Fe—Dy—Tb—X is by using electron beam co-evaporation (e-beam co-evap) onto a substrate in high vacuum conditions (generally up to about $10^{-8}$ Torr of base pressure) from the simultaneous evaporation of the individual metals Fe, Dy, Tb, or various combination of bimetals such as FeDy and/or FeTb, for example. A thin film deposition rate for the e-beam process can be in the range of 0.1 Angstroms per minute to 100 Angstroms per minute.

The e-beam co-evap process can be carried out with substrates held at low temperatures, such as, for example, ambient temperature (also known as room temperature), which is generally regarded as being in the range of 20 to 25° C. As stated above, ambient temperature manufacturability is a desirable and advantageous aspect for the formation of technologically relevant materials, such as the amorphous Fe—Dy—Tb—X thin films described herein. Since the e-beam co-evap process allows significantly larger range of growth rates, as well as higher growth rates of the films, this makes it a desirable attribute for manufacturing purposes. The e-beam co-evap process also overcomes the limitations of achieving good stoichiometry using e-beam evaporation from a multi-element target. This is because in e-beam from multi-component targets, the film stoichiometry is different from the target due to the different evaporation rates of the elements. However, e-beam co-evap can overcome this limitation since the rates of deposition of the individual elements can be independently controlled to achieve the desired film stoichiometry.

Yet another method of making thin amorphous films of the Fe—Dy—Tb—X is by using sputtering technique (magnetron, rf, ion beam, etc.) onto a substrate in high vacuum conditions (generally up to about $10^{-8}$ Torr of base pressure) from either a solid target of desired composition or by the simultaneous sputtering from individual solid metals or individual combinations of solid bimetals made from individual metals Fe, Dy, Tb, or various combination of bimetals such as FeDy and/or FeTb, for example. A thin film deposition rate for the sputtering process can be in the range of 1 Angstrom per minute to 1000 Angstroms per minute. Because sputtering systems are well established in the semiconductor industry for deposition of films onto large substrates, they are a potentially relevant route to manufacture these films.

Oxidation process for sputtered films can be performed by exposing the deposited film to air inside the chamber, or by removing into ambient air, both of which could be at room temperature. Alternately, the film can be oxidized by exposing it to air or other gases at a higher temperature on a hot plate or in a furnace in order to further change/control its properties.

Nitridation, sulfurization, and/or hydrogenation processes for sputter deposited evaporated films can be performed by exposing the deposited film to pertinent gases at high temperature inside a furnace. This can also further change/control the materials properties.

Because Fe—Dy—Tb—X films can be deposited on substrates at low temperatures, a variety of substrates can be utilized for carrying out the present invention, including flexible plastics, glass, ceramic and metallic substrate materials. Substrate materials that cannot withstand high temperatures can be attractive substrates. Thus, various semiconductor devices, especially transparent semiconductor devices, can be made, particularly when transparent substrates are used.

EXAMPLES

Amorphous Fe—Dy—Tb—X films were prepared by the PLD process described hereinabove. A variety of tests were performed to confirm the composition, properties, and characteristics of the films, as described hereinbelow.

Figure 1:
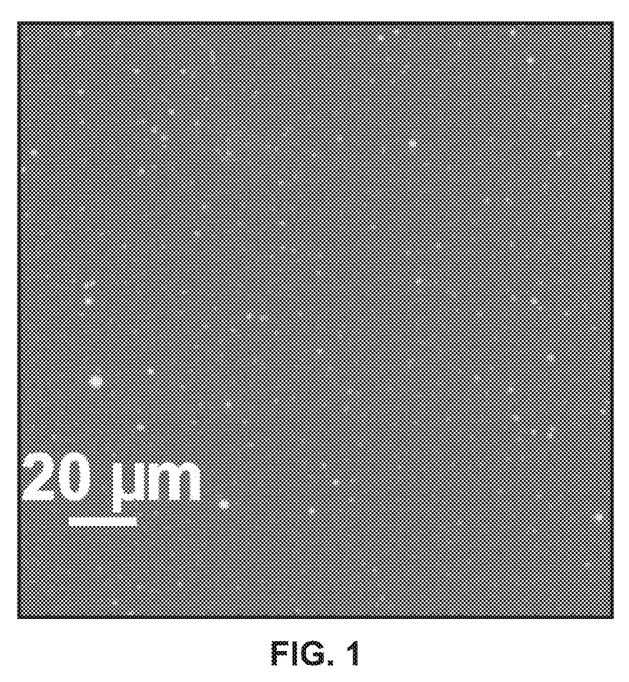
FIG. 1 is a scanning electron microscope (SEM) image of an iron-dysprosium-terbium-oxygen (Fe—Dy—Tb—O) film on a Si substrate.
Figure 2:
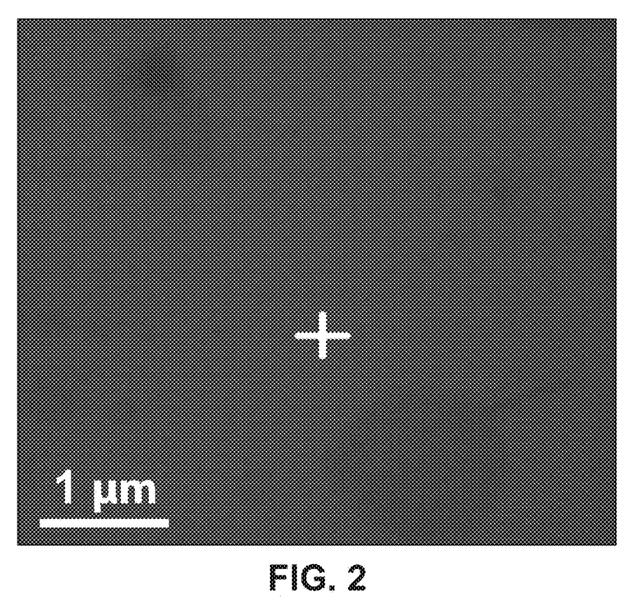
FIG. 2 is a high-magnification SEM image of a Fe—Dy—Tb—O film on a Si substrate.

The SEM images in FIGS. 1 and 2 show a smooth morphology of an as-deposited Fe—Dy—Tb—O film, including particulates known typical of a PLD process.

Figure 3:
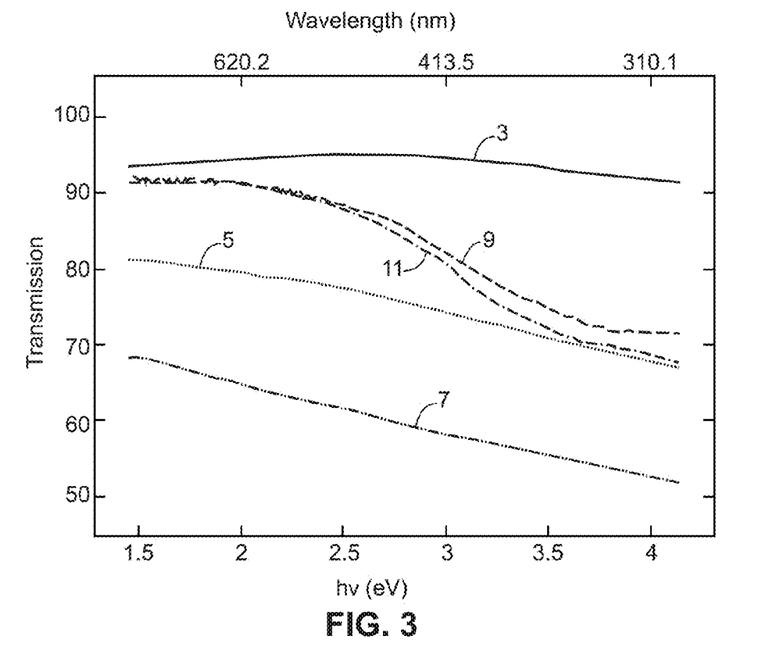
FIG. 3 is a graph showing optical transmission data as a function of wavelength for various Fe—Dy—Tb—O films.

FIG. 3 shows optical transmission data as a function of wavelength for Fe—Dy—Tb—O films of various thicknesses. the transparency was increased by annealing the films (25 nm thickness film shown here) in nitrogen or oxygen atmosphere at 773 K. Curves on the graph are identified in Table 1.

TABLE 1

| Curve No. | FeDT Film Thickness |
|---|---|
| 3 | 9 nm |
| 5 | 25 nm |
| 7 | 37 nm |
| 9 | 25 nm nitrogen annealed |
| 11 | 25 nm oxygen annealed |

Optical transparency in the range of 50% to 90% over a large range of wavelengths was observed, a range of 70% to 90% being more preferable for some applications. Optical transparency of the films can be controlled by changing the thickness of the film, as well as by annealing. Optical transparency of the films makes them suitable for use in display applications.

Figure 4:
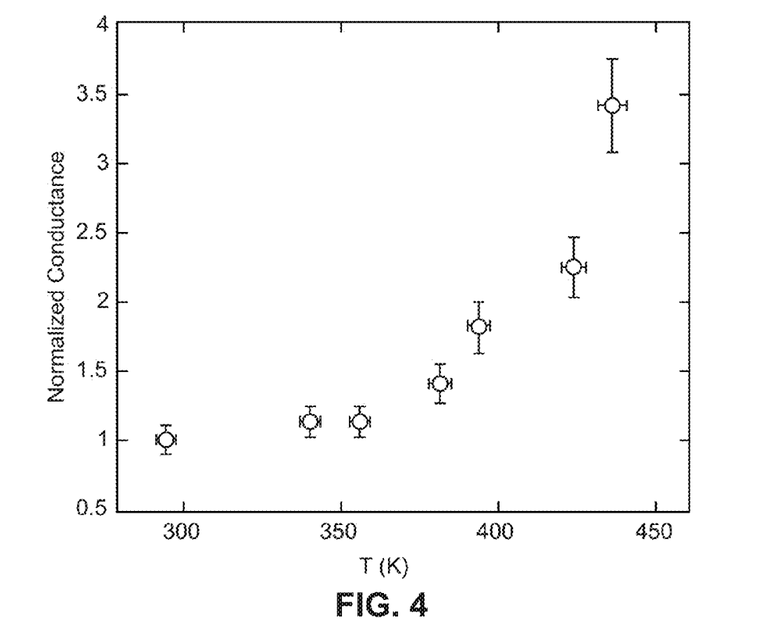
FIG. 4 is a graph showing electrical conductance in as-deposited Fe—Dy—Tb—O films measured as a function of temperature. The conductance has been normalized to its value at room temperature.

FIG. 4 shows normalized electrical conductance change of the thin film as a function of temperature in the range of room temperature (~295 K) to ~435 K. The increase in conductance with increasing temperature is representative of semiconducting behavior in which the concentration of current carrying charge carriers is increased due to excitation over an energy barrier. The conductance of the thin films was measured using 4-probe resistance measurements. The room temperature resistivity of the as-deposited films were found to be of the order of 10 ohm-cm.

Figure 5:
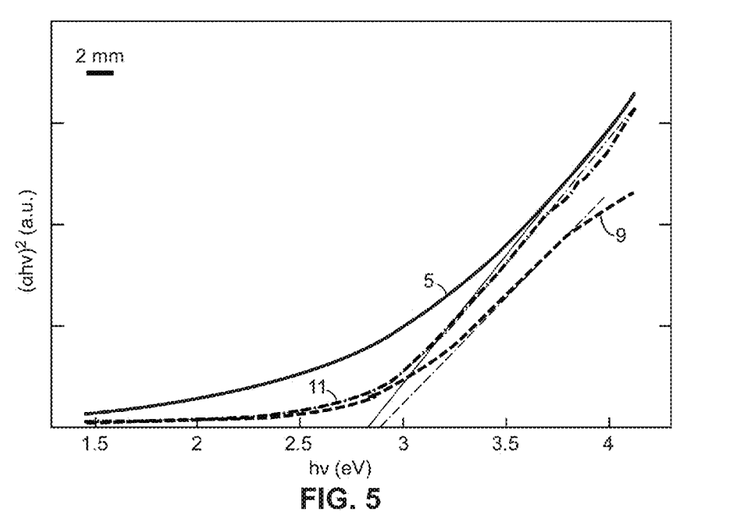
FIG. 5 is a graph showing Tauc plots of various Fe—Dy—Tb—O films.

FIG. 5 is a graph showing Tauc plots of as-deposited and annealed Fe—Dy—Tb—O films. As-deposited, nitrogen-annealed, and oxygen-annealed, 25 nm films deposited on glass substrates were observed to be transparent. Curves on the graph are identified in Table 1. By extrapolating the rapidly rising portion of the curve, band gaps were calculated, shown by lighter scale, straight lines.

Figure 6:
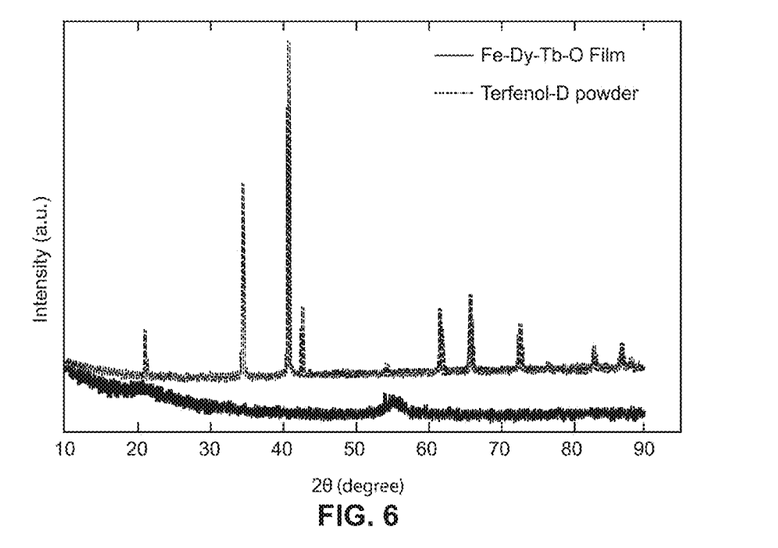
FIG. 6 is a graph showing glancing incidence X-ray diffraction (GiXRD) data for crystalline terfenol-D powder target material, and for as-deposited, amorphous Fe—Dy—Tb—O film.

In general, a semiconductor material can exist in crystalline or amorphous forms. FIG. 6 shows glancing incidence x-ray diffraction(GiXRD) data from an as-deposited FeDT film. The generally featureless spectrum is illustrative of an essentially amorphous film. In contrast, the GiXRD from powder made from the target material shows polycrystalline microstructure consistent with the terfenol-D composition.

Figure 7:
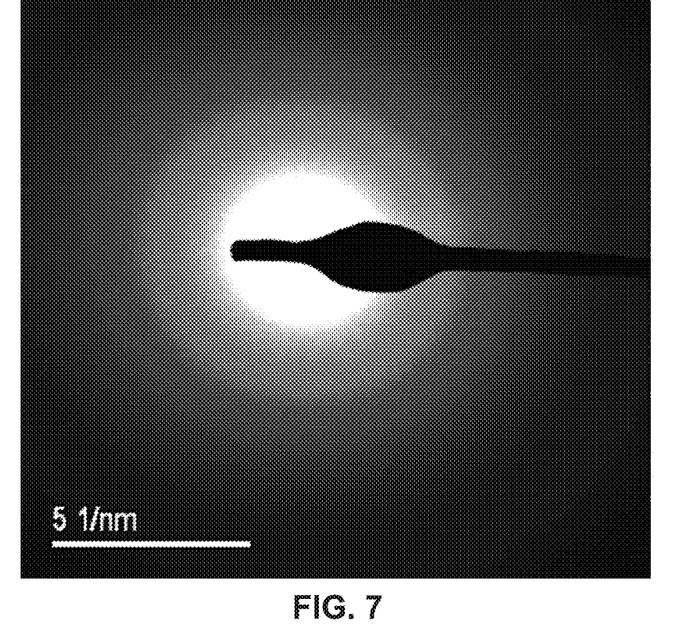
FIG. 7 is a selected area diffraction pattern of an as-deposited, amorphous Fe—Dy—Tb—O film.

FIG. 7 is an X-ray diffraction pattern for an as-deposited FeDT film, showing that the film is amorphous.

Figure 8:
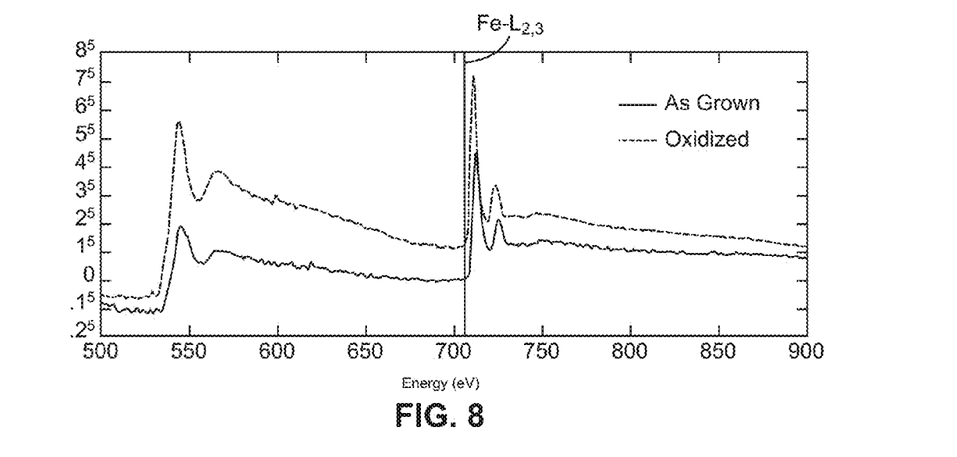
FIG. 8 is a graph showing electron energy loss spectrum (EELS) at a specific location comparing as-deposited and oxygen annealed Fe—Dy—Tb—O films.

The various constituents of an as-deposited FeDT thin film were measured using TEM electron energy loss spectroscopy (EELS). FIG. 8 shows EELS of an as-deposited FeDT and oxidized films at specific location showing oxygen and iron signals. From similar scans at different locations the film was found to have homogenous composition of Fe:Dy:Tb:O. The measured elements for the oxidized film were Fe:Dy:Tb:O in the respective ratio of 26:9:13:52.

Figure 9:
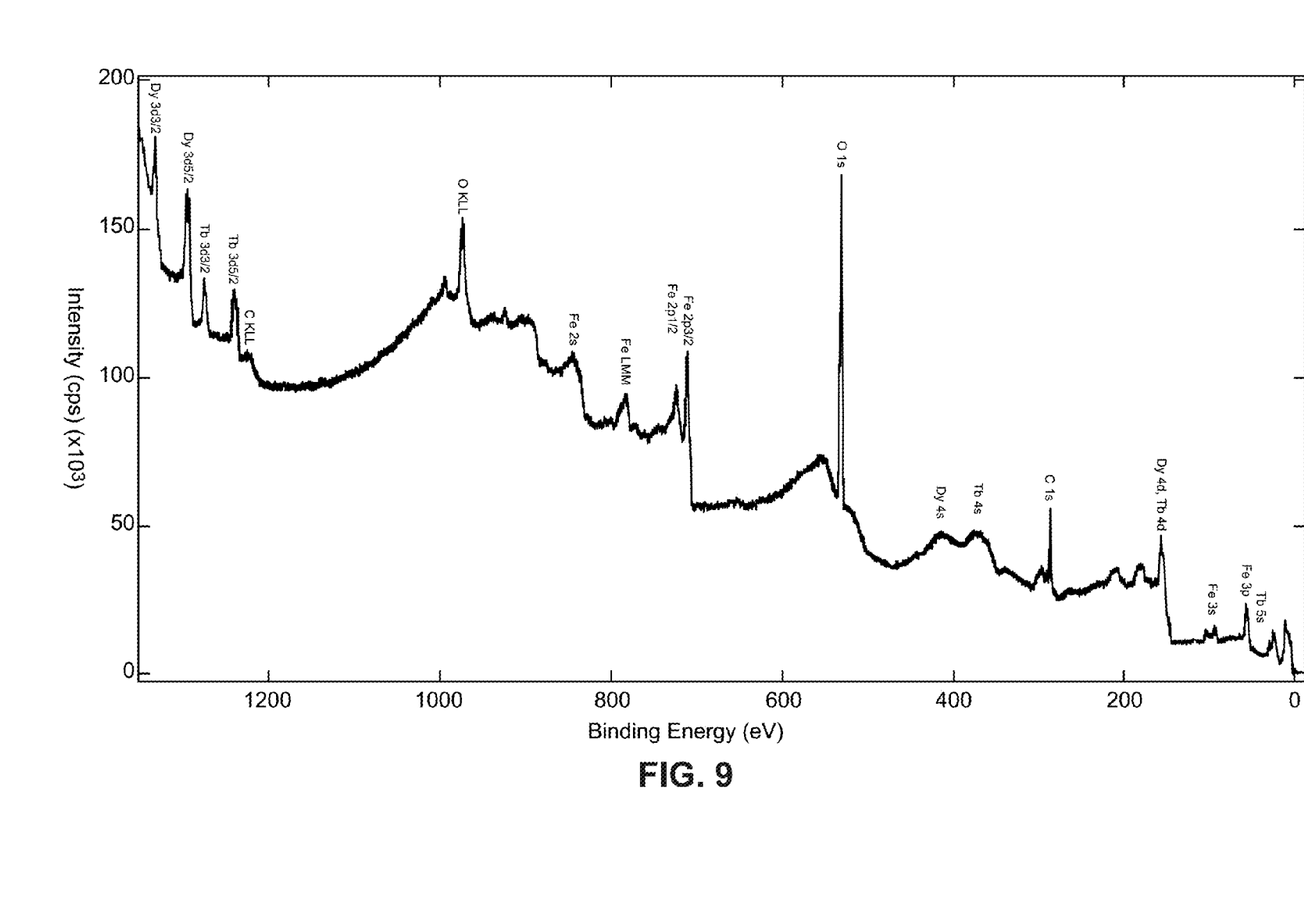
FIG. 9 is a spectrum of an oxidized Fe—Dy—Tb—O film taken with x-ray photoelectron spectroscopy (XPS).

Additional measurements of the surface elemental constitution were performed using X-ray photo-electron spectroscopy (XPS) as shown in FIG. 9. This also confirmed that the major constituents of the thin film were Fe:Dy:Tb:O.

Figure 10:
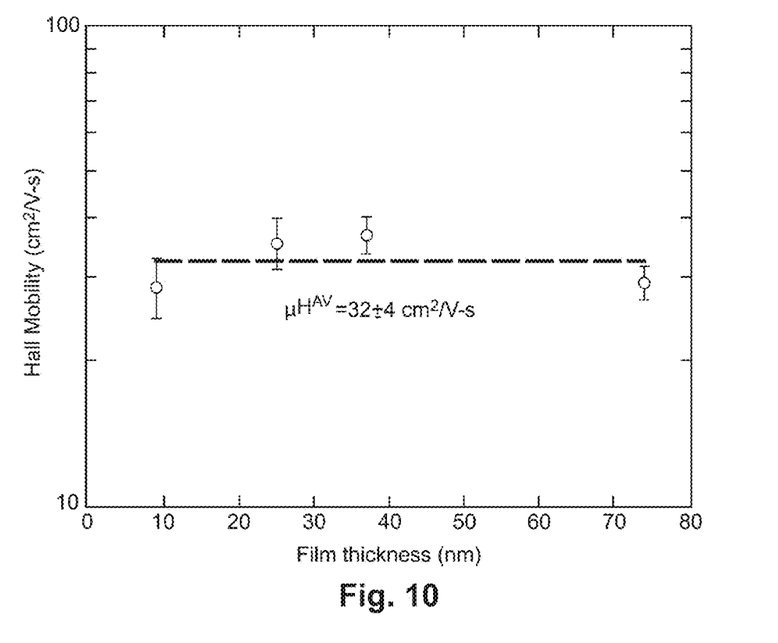
FIG. 10 is a graph showing electrical carrier Hall mobility (>30 cm$^2$/V-s) of as-deposited amorphous Fe—Dy—Tb—O films as a function of film thickness (9 to 74 nm).

FIG. 10 shows electrical carrier Hall mobility (>30 cm$^2$/V-s) of as-deposited amorphous Fe—Dy—Tb—O films as a function of film thickness (9 to 74 nm). This indicates that the film has useful for achieving both n-type and p-type semiconductor behavior.

Figure 11:
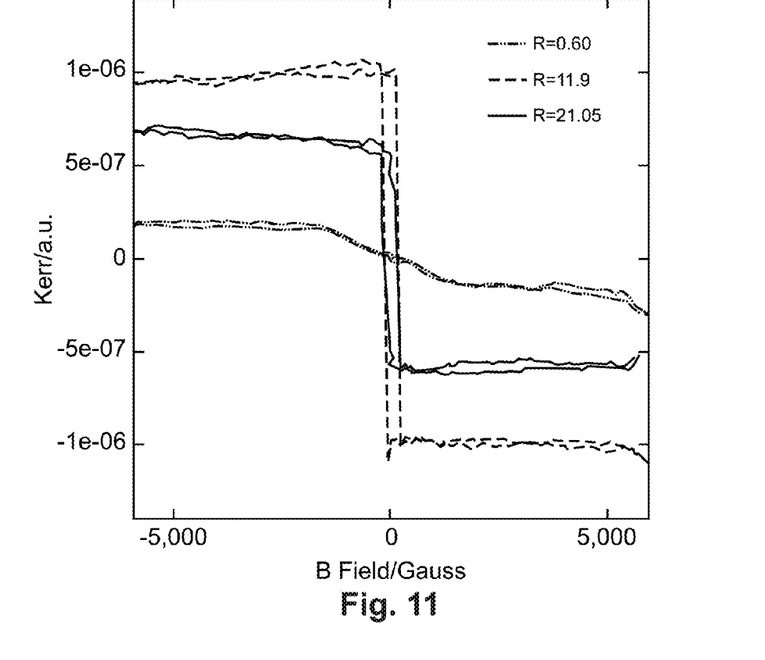
FIG. 11 is a graph showing magnetic hysteresis loops obtained at room temperature for various compositions of Fe—Dy—Tb—O films, as measured by surface magneto-optical Kerr effect technique.
Figure 12:
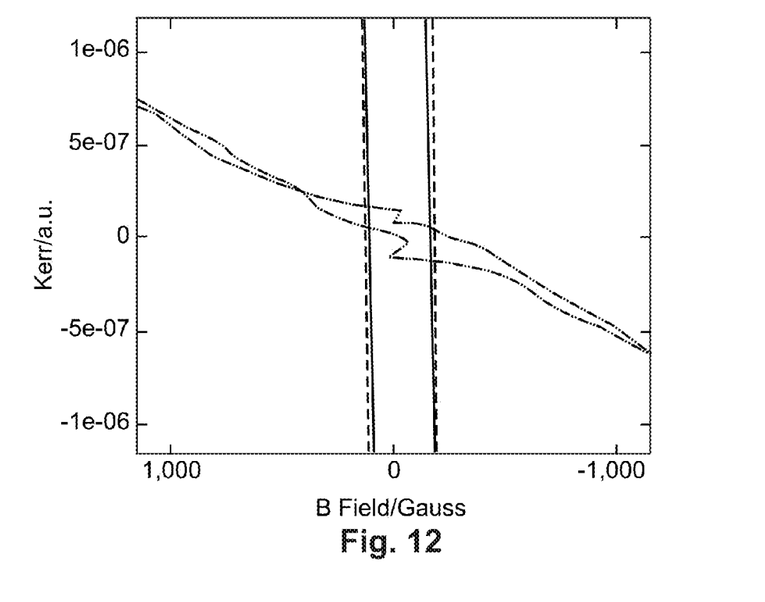
FIG. 12 is an enlargement of a portion of the graph shown in FIG. 11.

FIGS. 11 and 12 show magnetic hysteresis loops obtained at room temperature for various compositions of Fe—Dy—Tb—X films with R representing the ratio of Fe to Tb+Dy as measured in atomic weight %, as measured by surface magneto-optical Kerr effect technique.

Figure 13:
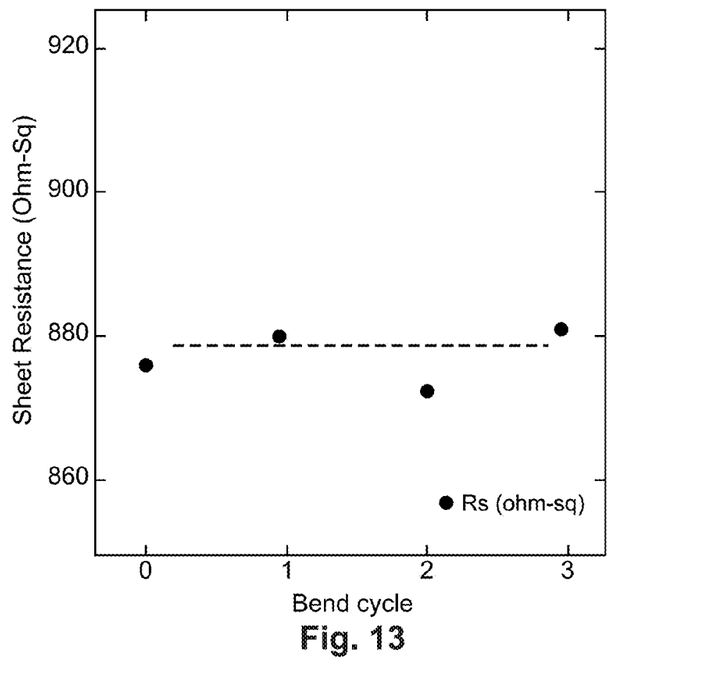
FIG. 13 is a graph showing that the electrical transport property of a Fe—Dy—Tb—O film deposited on a flexible polymer substrate is relatively unchanged following several bending (deformation) cycles.

FIG. 13 is a graph showing that the electrical transport property of a Fe—Dy—Tb—O film deposited on a flexible polymer substrate is relatively unchanged following several bending (deformation) cycles.

Figure 14:
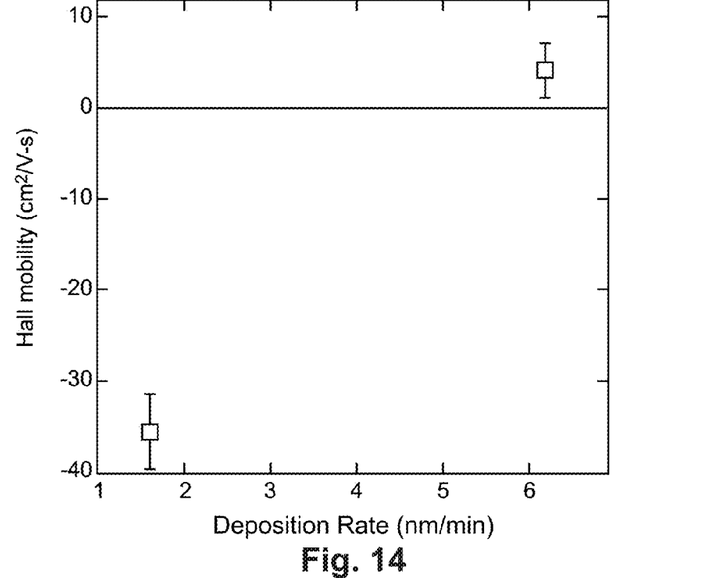
FIG. 14 is a graph showing that the electrical transport property of a Fe—Dy—Tb—O film deposited on a glass substrate can show either p-type behavior or n-type behavior, as ascertained by Hall mobility measurements. The p- or n-type is achieved by changing the film deposition conditions such as deposition rate and film thickness.

FIG. 14 shows that the electrical transport property of a Fe—Dy—Tb—O film deposited on a glass substrate can show either p-type behavior or n-type behavior, as ascertained by Hall mobility measurements. The p- or n-type is achieved by changing the film deposition conditions such as deposition rate and film thickness.

While there has been shown and described what are at present considered to be examples of the invention, it will be obvious to those skilled in the art that various changes and modifications can be prepared therein without departing from the scope of the inventions defined by the appended claims.

What is claimed is:

1. An amorphous semiconductor composition comprising 1 to 70 atomic percent iron, 15 to 65 atomic percent dysprosium, 15 to 35 atomic percent terbium, balance X, wherein X is at least one element selected from the group consisting of an oxidizing element and a reducing element, said composition having an essentially amorphous microstructure, an optical transmittance of at least 50% in at least the visible spectrum and semiconductor electrical properties.

2. An amorphous semiconductor composition in accordance with claim 1 wherein said semiconductor composition comprises 10 to 60 atomic percent iron.

3. An amorphous semiconductor composition in accordance with claim 1 wherein said semiconductor composition comprises 10 to 50 atomic percent iron.

4. An amorphous semiconductor composition in accordance with claim 1 wherein said semiconductor composition comprises 25 to 55 atomic percent dysprosium.

5. An amorphous semiconductor composition in accordance with claim 1 wherein said semiconductor composition comprises 20 to 30 atomic percent terbium.

6. An amorphous semiconductor composition in accordance with claim 1 wherein said oxidizing element is oxygen.

7. An amorphous semiconductor composition in accordance with claim 1 wherein said reducing element is at least one element selected from the group consisting of sulfur, hydrogen, and nitrogen.

8. An amorphous semiconductor composition in accordance with claim 1 wherein said optical transmittance is at least 70% in the visible spectrum.

9. An amorphous semiconductor composition in accordance with claim 1 wherein said semiconductor composition is characterized by room temperature ferromagnetism.

10. An amorphous semiconductor composition in accordance with claim 1 wherein said semiconductor composition is characterized by semiconductor electrical behavior.

11. A semiconductor device comprising a substrate having an amorphous semiconductor layer adherently disposed thereon, said amorphous semiconductor layer comprising 1 to 70 atomic percent iron, 15 to 65 atomic percent dysprosium, 15 to 35 atomic percent terbium, balance X, wherein X is at least one element selected from the group consisting of an oxidizing element and a reducing element, said composition having an essentially amorphous microstructure, an optical transmittance of at least 50% in at least the visible spectrum and semiconductor electrical properties.

12. A semiconductor device in accordance with claim 11 wherein said semiconductor composition comprises 10 to 60 atomic percent iron.

13. A semiconductor device in accordance with claim 11 wherein said semiconductor composition comprises 10 to 50 atomic percent iron.

14. A semiconductor device in accordance with claim 11 wherein said semiconductor composition comprises 25 to 55 atomic percent dysprosium.

15. A semiconductor device in accordance with claim 11 wherein said semiconductor composition comprises 20 to 30 atomic percent terbium.

16. A semiconductor device in accordance with claim 11 wherein said oxidizing element is oxygen.

17. A semiconductor device in accordance with claim 11 wherein said reducing element is at least one element selected from the group consisting of sulfur, hydrogen, and nitrogen.

18. A semiconductor device in accordance with claim 11 wherein said optical transmittance is at least 70% in the visible spectrum.

19. A semiconductor device in accordance with claim 11 wherein said semiconductor composition is characterized by room temperature ferromagnetism.

20. A semiconductor device in accordance with claim 11 wherein said semiconductor composition is characterized by semiconductor electrical behavior.

* * * * *